(12) United States Patent
Vanden Brande et al.

(10) Patent No.: US 6,334,751 B1
(45) Date of Patent: Jan. 1, 2002

(54) AIR LOCK

(75) Inventors: Pierre Vanden Brande, Brussels; Alain Weymeersch, Wavre, both of (BE)

(73) Assignee: Recherche et Developpment du Groupe Cockerill Sambre, en abrégé RD-CS, Lège (BE)

( * ) Notice: Subject to any disclaimer, the term of this patent is extended or adjusted under 35 U.S.C. 154(b) by 0 days.

(21) Appl. No.: 09/450,114

(22) Filed: Nov. 26, 1999

(30) Foreign Application Priority Data

Nov. 26, 1998 (EP) .................................. 98870258

(51) Int. Cl.[7] ............................ F16J 15/16; B21B 45/00; C23C 14/56
(52) U.S. Cl. ........................ 414/217; 277/345; 118/733
(58) Field of Search ............................ 414/217; 277/345, 277/906, 245

(56) References Cited

U.S. PATENT DOCUMENTS 2,972,330 A    2/1961   Bugbee
3,158,507 A  * 11/1964  Alexander .............. 118/733 X
3,367,667 A  *  2/1968  Allen ..................... 118/733
3,467,399 A  *  9/1969  Kelley et al. ........... 277/345
3,868,106 A     2/1975  Donckel et al.
5,000,114 A  *  3/1991  Yanagi et al. .......... 118/733
5,865,932 A  *  2/1999  Funabashi et al. ..... 118/733 X

FOREIGN PATENT DOCUMENTS

EP          0 652 302        5/1995

* cited by examiner

*Primary Examiner*—Steven A. Bratlie
(74) *Attorney, Agent, or Firm*—Browdy and Neimark

(57) ABSTRACT

Air lock for introducing and continuously passing a strip of a substrate into and through a vacuum chamber, including an enclosure containing at least three successive rollers in the direction of travel of the strip and between which a passage is made for the strip, the first and third rollers being located on one side of this passage, the second roller being located on the opposite side of this passage, an essentially airtight region being formed between the strip and the first and third rollers and connected to a vacuum pump, a component being provided for adjusting the pressure with which the strip rests on the rollers.

5 Claims, 2 Drawing Sheets

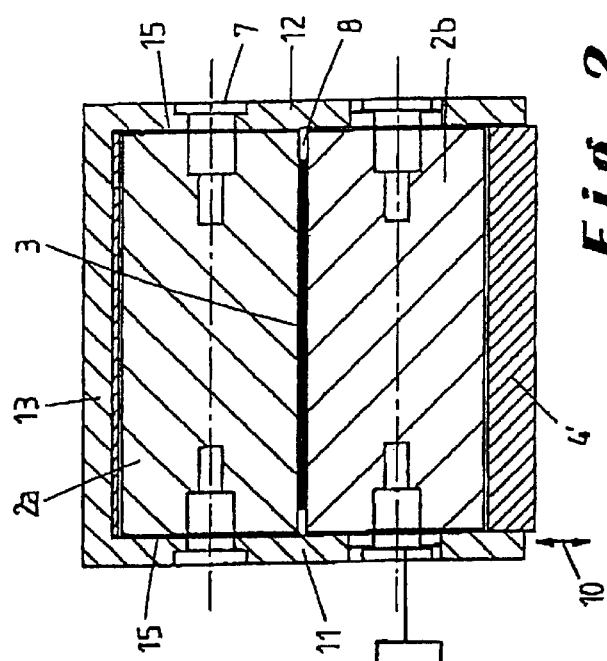
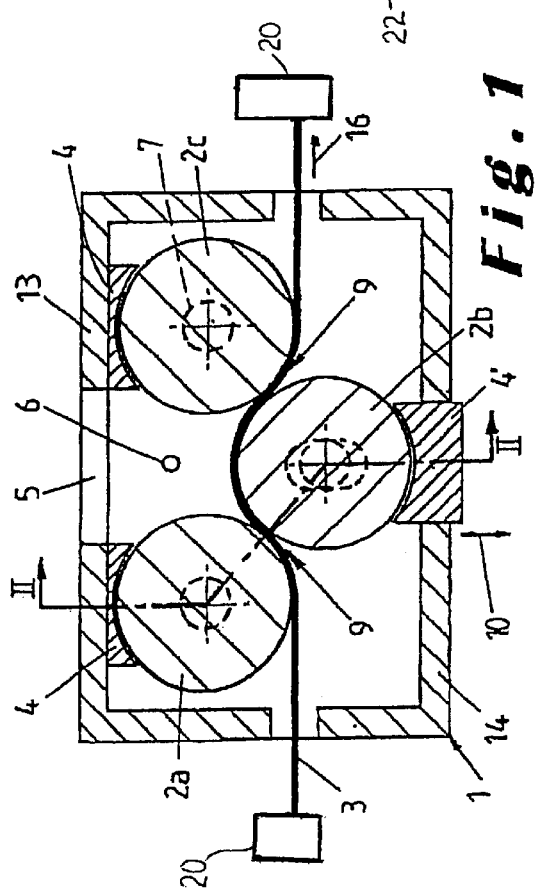
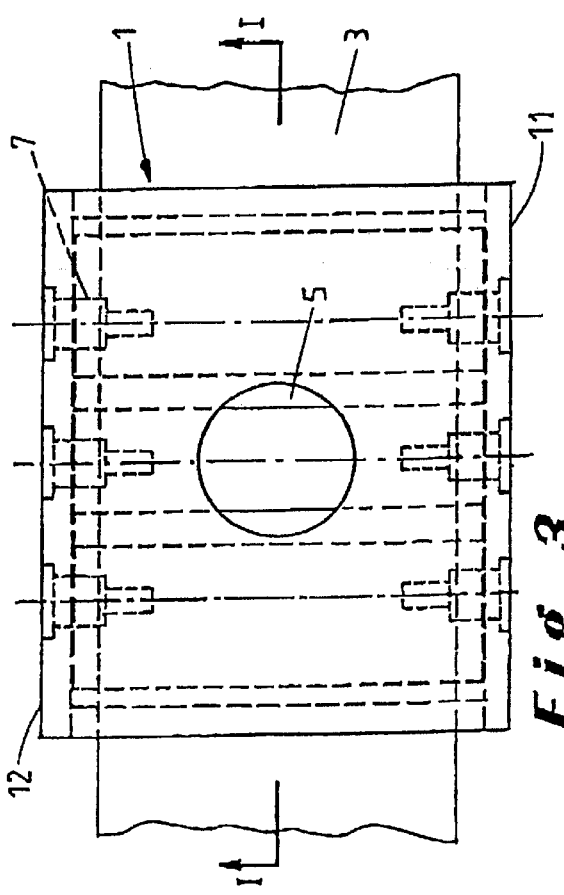

AIR LOCK

BACKGROUND OF THE INVENTION

The present invention relates to an air lock for introducing and continuously passing a strip of substrate, such as a metal sheet, into and through a vacuum chamber, comprising an enclosure in which there are mounted rollers which can rotate about parallel axes and between which the said strip can travel.

U.S. Pat. No. 3,868,106 discloses an air lock wherein all the rollers are aligned with respect to each other. The sealing is achieved by placing shoes with a slight clearance almost in contact with the strip. The strip is placed in contact with each of the rollers over an angle of 180 degrees. This device suffers from the drawback that it takes a lot of space. In addition, the presence of the shoes at opposite sides of each of the rollers in order to guarantee air-tightness between the chambers renders the device relatively complex. Due to the large angle of contact, it is difficult for applying a new strip in the passage between the rollers.

U.S. Pat. No. 2,972,330 discloses an air lock wherein the strip is in contact with each of the rollers over an angle of 180 degrees. The air-tightness between the regions is again guaranteed due to the presence of shoes. This device suffers therefore also from the drawbacks of U.S. Pat. No. 3,868,106.

SUMMARY OF THE INVENTION

One of the objects of the invention is to present an air lock which makes it possible, simultaneously, to achieve a minimum size and maximum air-tightness for the continuous passage of a strip of substrate.

To this end, according to the invention, the aforementioned enclosure contains at least three successive rollers extending in the direction of travel of the strip and between which there is a passage for the latter, the first and third rollers being located on one side of this passage whilst the second roller is arranged on the opposite side of this passage with respect to the two aforementioned rollers, and means allowing an essentially airtight region to be formed between a strip travelling through the said passage and the first and third rollers, this region being connected to a vacuum pump, other means being provided for adjusting the pressure with which the strip rests on these rollers.

BRIEF DESCRIPTION OF THE DRAWINGS

Other details and specific features of the invention will emerge from the description, given hereinafter, by way of non-limiting examples, of two particular embodiments of the air lock according to the invention, with reference to the appended drawings.

FIG. 1 is a diagrammatic view of a longitudinal section of a first embodiment of the air lock according to the invention.

FIG. 2 is a section on the line II—II of FIG. 1.

FIG. 3 is a plan view of FIG. 1.

DESCRIPTION OF THE PREFERRED EMBODIMENTS

Figure 4:
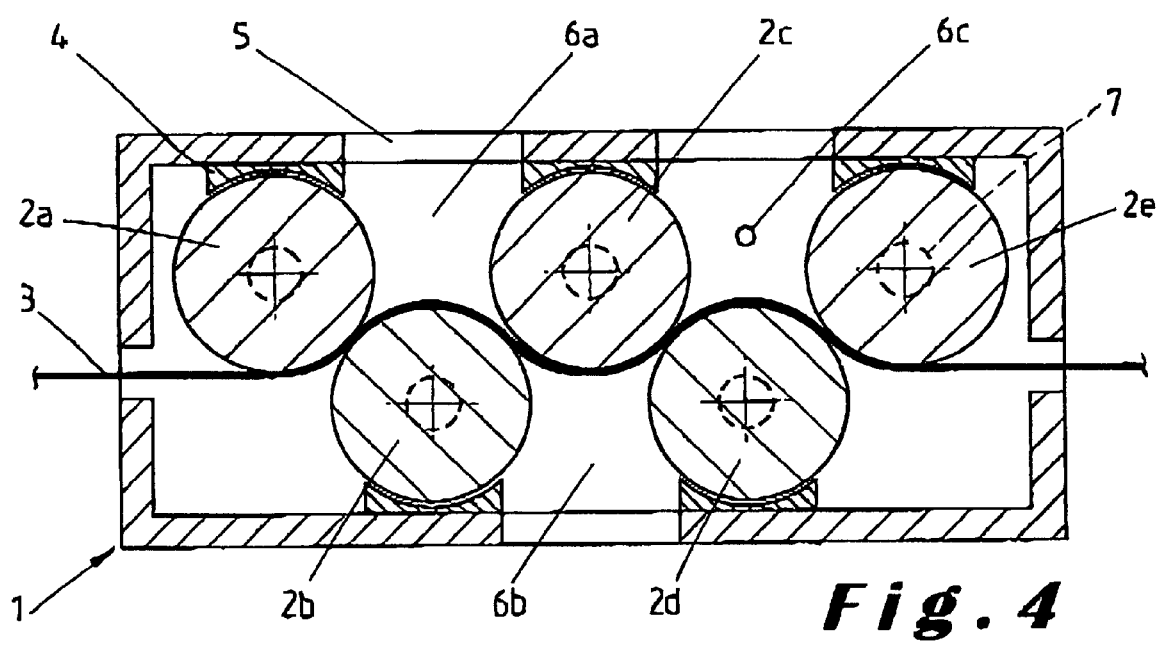
FIG. 4 is a view in section similar to FIG. 1, of a second embodiment of the air lock according to the invention.

In the various figures, the same reference numerals relate to the same elements or to similar elements.

In general, the invention relates to an air lock intended to be arranged upstream of the entrance to, and downstream of the exit from, a vacuum chamber through which a strip of substrate, particularly a steel sheet, passes continuously.

The two air locks may be identical or different according to the strength of the vacuum which has to be maintained in the aforementioned chamber.

Mounted in each of these air locks are rollers which can rotate freely about their axes which extend transversely with respect to the direction of travel of the strip and parallel to one another.

These air locks are characterised by the fact that the rollers are offset from one another in the direction of travel of the strip.

Advantageously, the enclosure of an air lock contains at least three successive rollers which are offset in the direction of travel of the strip and between which there is a passage for the latter.

The first and third rollers are located on one side of this passage or of the strip travelling through the latter, while the second roller is located on the opposite side of this passage or of the strip with respect to the two previous rollers and this is so as to form an essentially airtight region between this strip and the first and third rollers.

To maintain a depression in this region, this region is connected to a vacuum pump and means are provided for adjusting the pressure with which the strip rests on the rollers according to the pressure difference between this region and its surroundings.

FIGS. 1 to 3 diagrammatically show a first particular embodiment of an air lock according to the invention.

This air lock consists of a parallelepipedal box 1 delimiting an enclosure in which are arranged three rollers 2a, 2b and 2c with horizontal and parallel axes arranged with a horizontal offset and in such a way as to form, between two consecutive rollers, a passage 9 through which a continuous sheet 3 is guided.

The rollers 2a and 2c are arranged above this passage 9, while the intermediate roller 2b is between the two rollers 2a and 2c underneath this passage. These three rollers thus form successive rollers, that is to say ones which are offset in the direction of travel of the strip 3, indicated by the arrow 16. The rollers 2a and 2c belong to a first series of rollers, while the roller 2b belong to a second series of rollers. Thus, a region 6 is formed between these rollers, the side walls 11 and 12 of the box 1, and the strip 3. The air-tightness of this region is ensured by providing minimum clearance between the side walls 11 and 12 of the box 1 and the rollers 2a, 2b and 2c, and by sealing members 4 between the cylindrical walls of the rollers and the upper wall 13 and lower wall 14 of the box 1. The sealing members are in particular made of Teflon, but could also for example be made of metal. A clearance of at least 0.2 mm is provided between the rollers and the sealing members. The sheet 3 provides the main airtightness between two successive rollers by travelling with a determined pressure against part of the cylindrical surface of these rollers.

The only, relatively significant, leakage occurs at the slots 8 which remain between the side walls of the strip 3 and the side walls 11 and 12 of the box.

To maintain a minimum leakage between the two planar end faces 15 of the rollers 2a, 2b, 2c and the side walls 11 and 12 of the box 1, these rollers are mounted so that they can rotate about bearings 7 which are arranged inside the ends of these rollers 2.

To compensate for these leaks, which are inevitable, this region 6 is connected to a vacuum pump, not depicted, by an opening 5 made in the top wall 13 of the box 1.

Advantageously, in the particular embodiment depicted in FIGS. 1 to 3, the bearings 7 of the roller 2b are mounted in such a way that they can experience a slight vertical movement in the side walls 11 and 12. The same is true of the sealing member 4 collaborating with the cylindrical surface of this roller 2b, which can be mounted so that it can slide vertically, as shown by the arrows 10, in the lower wall 14 of the box 1. It should be noted that the sliding sealing member 4' is in near contact with the lower wall 14 of the box 1 to guarantee air-tightness. It is thus possible to adjust readily the distance between two successive rollers and thus the cross section of the passage 9 between these rollers according to the thickness of the metal sheet 3.

The diameter of the rollers 2a, 2b and 2c, which is generally identical for all three rollers, is high enough that no plastic deformation of the metal sheet 3 is caused. Advantageously, for a metal sheet 1 mm thick, this diameter is at least 600 mm.

Furthermore, to ensure that the region 6 is airtight, it is important that the contact pressure between metal sheet and rollers serving to ensure the air-tightness of this region should at least balance the pressure difference between the pressure obtaining in this region and its surroundings. Thus, for a pressure difference of 500 mbar and a roller with a diameter of 600 mm and a strip 1 mm wide, the tension to be exerted on the metal strip in the direction of travel indicated by the arrow 16 is advantageously at least 3000 kg which, for a metal sheet 1 mm thick, corresponds to a tension of 3 kg per mm$^2$. For a metal sheet of the same width but 0.5 mm thick, the tension then becomes 6 kg per mm$^2$. If the maximum tension is restricted to, for example, 6 kg per mm$^2$ then a metal sheet of 0.25 mm thick will provide air-tightness only up to a maximum pressure difference of 250 mbar.

In general, the following equation may be used:

$$F \geq \Delta p \times D \times w$$

wherein:

F is the tension to be applied (in kg);

$\Delta p$ is the maximum pressure difference between two successive regions (in bar);

D is the diameter of the roller (in cm); and w is the width of the strip (in cm).

With the first example, the equation leads to:

$$F \geq 0.5 \text{ bar} \times 60 \text{ cm} \times 100 \text{ cm} = 3000 \text{ kg}$$

FIG. 4 relates to a second embodiment of the air lock according to the invention, which can be distinguished from the previous embodiment in that the box 1 contains a succession of three essentially airtight regions 6a, 6b and 6c which are obtained by providing five consecutive rollers, located alternately on one side of the strip 3 and on the other, in the box 1. Rollers 2a, 2c and 2e belong to the first series of rollers, while 2b and 2d belong to the second series of roller.

Thus, if, as mentioned with respect to the first aforementioned embodiment, the maximum tension is limited to, for example, 6 kg per mm$^2$, a metal sheet 0.25 mm thick provides the desired air-tightness only up to a maximum pressure difference between two successive regions of this second embodiment which is limited to 250 mbar. This therefore dictates that there be two additional regions in the box, and this is therefore obtained by increasing the number of successive rollers extending alternately on one side of the strip and on the other.

It is clearly understood that the invention is not restricted to the embodiments described hereinabove and illustrated by the appended figures of an air lock, but that other variations may be envisaged, particularly as regards the number of rollers, their relative arrangement and any means which may be provided for adjusting the distance between two successive rollers and the means provided for ensuring air-tightness between the walls of the box and the rollers.

Furthermore, when the thickness of the metal sheets that are to be processed is relatively great with respect to their width, it may be beneficial in certain instances to provide additional sealing means arranged in the slots 8 between two successive rollers on each side of the lateral edges of the metal sheet.

FIG. 1 further illustrates two means 20 for adjusting the tension applied to metal sheet three. FIG. 2 shows a device 22 coupled to a bearing of roller 2b in order to displace roller 2b in the direction of arrow 10. Suitable tensioning devices and roller displacement device are well known in the art.

What is claimed is:

1. An air lock for introducing and continuously passing a strip of substrate, such as a metal sheet, along a travel path and in a direction of travel into and through a vacuum chamber, the strip having a thickness, said air lock comprising:

a) an enclosure having a wall;

b) a first series of rollers comprising at least two rollers mounted in the enclosure and located on a first side of the travel path, said first series of rollers being mounted to rotate about parallel axes;

c) at least one second roller mounted in the enclosure offset from the rollers of the first series and located on a second side of the travel path, said second roller being mounted to rotate about an axis parallel to the axes of the first rollers;

d) a passage for travel of the strip along the travel path being provided between each two consecutive rollers for causing the strip to be in contact with each of the rollers over an angle of less than 180 degrees with respect to the axis of each of the rollers, and the passage having a thickness corresponding to the thickness of the strip;

e) the rollers being positioned relative to one another such that when the strip is present on the path, the strip, the at least two rollers of the first series and the second roller define an essentially airtight region connected to a vacuum pump;

f) means for applying a tension to the strip to create a contact pressure between the strip and the rollers sufficient to absorb a difference in pressure between the essentially airtight region and adjacent regions within said enclosure while ensuring the airtightness of the essentially airtight region; and g) sealing members provided between the wall of the enclosure and the rollers with a minimal clearance between the sealing members and the rollers.

2. The air lock according to claim 1, further comprising means for adjusting the distance between at least two adjacent rollers.

3. The air lock according to claim 2, wherein the means for adjusting the distance between at least two adjacent rollers are provided for adjusting in a direction essentially perpendicular to the direction of travel of the strip.

4. The air lock according to claim 1, wherein the means for applying tension apply a tension force, F, at least equal to:

$$F \geq \Delta p \times D \times w$$

wherein:

F is the tension to be applied (in kg);

$\Delta p$ is the maximum pressure difference between two successive regions (in bar);

D is the diameter of the roller (in cm); and w is the width of the strip (in cm).

5. A combination comprising a substrate strip and an air lock for introducing and continuously passing said strip along a travel path and in a direction of travel into and through a vacuum chamber, said strip having a first side and a second side, a thickness between the first and second sides and a width transverse to the thickness and to the direction of travel, said air lock comprising:

a) an enclosure having a wall;

b) a first series of rollers comprising at least two rollers mounted in the enclosure and contacting the first side of said strip, said first series of rollers being mounted to rotate about parallel axes;

c) at least one second roller mounted in the enclosure offset from the rollers of the first series and contacting the second side of said strip, said second roller being mounted to rotate about an axis parallel to the axes of the first rollers;

d) a passage for travel of said strip along the travel path being provided between each two consecutive rollers for causing said strip to be in contact with each of the rollers over an angle of less than 180 degrees with respect to the axis of each of the rollers, and the passage having a thickness corresponding to the thickness of said strip;

e) the rollers being positioned relative to one another such that when said strip is present on the path, said strip, the at least two rollers of the first series and the second roller define an essentially airtight region connected to a vacuum pump;

f) means for applying to said strip a tension force, F, at least equal to:

$$F \geq \Delta p \times D \times w$$

wherein:

F is the tension to be applied (in kg);

$\Delta p$ is the maximum pressure difference between two successive regions (in bar);

D is the diameter of the roller (in cm); and w is the width of the strip (in cm), to create a contact pressure between said strip and said rollers sufficient to absorb a difference in pressure between the essentially airtight region and adjacent regions within said enclosure while ensuring the airtightness of the essentially airtight region; and g) sealing members provided between the wall of the enclosure and said rollers with a minimal clearance between the sealing members and said rollers.

* * * * *